United States Patent
Pavier

(10) Patent No.: US 6,858,922 B2
(45) Date of Patent: Feb. 22, 2005

(54) BACK-TO-BACK CONNECTED POWER SEMICONDUCTOR DEVICE PACKAGE

(75) Inventor: Mark Pavier, Guildford (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/050,002

(22) Filed: Jan. 15, 2002

(65) Prior Publication Data

US 2002/0096748 A1 Jul. 25, 2002

Related U.S. Application Data

(60) Provisional application No. 60/262,890, filed on Jan. 19, 2001.

(51) Int. Cl.[7] .............................................. H01L 23/495
(52) U.S. Cl. ...................... 257/676; 257/670; 257/671; 257/685; 257/686; 257/689; 257/777; 257/787; 361/760; 438/108; 438/109
(58) Field of Search ................................ 257/670, 671, 257/676, 686, 685, 689, 713, 777, 778, 783, 787; 361/760; 438/108, 109

(56) References Cited

U.S. PATENT DOCUMENTS

| | | | | |
|---|---|---|---|---|
| 4,993,148 A | * | 2/1991 | Adachi et al. ................. | 29/832 |
| 5,147,815 A | * | 9/1992 | Casto .......................... | 29/827 |
| 5,340,771 A | * | 8/1994 | Rostoker ...................... | 29/827 |
| 5,545,922 A | * | 8/1996 | Golwalkar et al. .......... | 257/676 |
| 5,596,225 A | * | 1/1997 | Mathew et al. .............. | 257/667 |
| 5,620,928 A | * | 4/1997 | Lee et al. ..................... | 438/118 |
| 5,625,226 A | * | 4/1997 | Kinzer .......................... | 257/705 |
| 5,719,436 A | * | 2/1998 | Kuhn ............................ | 257/676 |
| 5,793,108 A | * | 8/1998 | Nakanishi et al. ........... | 257/723 |
| 6,020,636 A | * | 2/2000 | Adishian ...................... | 257/728 |
| 6,069,025 A | * | 5/2000 | Kim .............................. | 438/109 |
| 6,072,243 A | * | 6/2000 | Nakanishi .................... | 257/783 |
| 6,118,184 A | * | 9/2000 | Ishio et al. ................... | 257/787 |
| 6,133,067 A | * | 10/2000 | Jeng et al. ................... | 438/110 |
| 6,175,149 B1 | * | 1/2001 | Akram ......................... | 257/675 |
| 6,313,527 B1 | * | 11/2001 | Han et al. ..................... | 257/723 |
| 6,340,839 B1 | * | 1/2002 | Hirasawa et al. ............ | 257/672 |
| 6,344,687 B1 | * | 2/2002 | Huang et al. ................ | 257/724 |
| 6,353,265 B1 | * | 3/2002 | Michii .......................... | 257/777 |
| 6,376,910 B1 | * | 4/2002 | Munoz et al. ............... | 257/741 |

FOREIGN PATENT DOCUMENTS

| | | | |
|---|---|---|---|
| JP | 10256470 A | * | 9/1998 |
| JP | 11317488 A | * | 11/1999 |

* cited by examiner

*Primary Examiner*—Tom Thomas
*Assistant Examiner*—Chris Chu
(74) *Attorney, Agent, or Firm*—Ostrolenk, Faber, Gerb & Soffen, LLP

(57) ABSTRACT

A small footprint package for two or more semiconductor die includes first and second die, mounted on opposite respective surfaces of a lead frame pad in vertical alignment with one another. A conductive or insulation adhesive can be used. The die can be identical MOSgated devices connected in series, or can be one power die and a second IC die for the control of the power die.

8 Claims, 2 Drawing Sheets

BACK-TO-BACK CONNECTED POWER SEMICONDUCTOR DEVICE PACKAGE

RELATED APPLICATION

This application claims the benefit of U.S. Provisional Application No. 60/262,890, filed Jan. 19, 2001.

FIELD OF THE INVENTION

This invention relates to semiconductor device packages and more specifically relates to a novel package having a minimized area or "footprint".

BACKGROUND OF THE INVENTION

Many packages are known which contain plural semiconductor die such as two power MOSFETs, or other switching or MOSgated devices (MOSFETs, IGBTs, thyristors, and the like) or a power MOSgated device die and a control circuit die for the power MOSFET die. Such packages can define series or parallel connected die or a "smart" power semiconductor in which a power device is controlled by an integrated circuit die. These die are generally laid out side by side and are laterally spaced atop a lead frame, or other support surface and are connected through the lead frame and/or by wire bonds to their upper surfaces. Other geometries are known in which one chip is fixed to the top of another chip, with the chips interconnected by laterally displaced wire bonds to a lead frame.

These arrangements of die take up lateral space or area and a relatively large "footprint" or area is required on the support substrate to support the die.

In applications, in which space is at a premium, as in portable electronic devices, it would be desirable to provide a package structure which could have the same effective active area of silicon for the power die and control die but which has a reduced footprint on the support such as a printed circuit board.

BRIEF DESCRIPTION OF THE INVENTION

In accordance with the invention, first and second semiconductor die are mounted on the opposite respective surfaces of a copper (or other conductive material) lead frame mounting pad, in lateral alignment with one another. The two die may be identical MOSgated devices such as MOSFETs or IGBTs, with their drain electrodes connected to the opposite lead frame surfaces by a suitable die attach material such as a silver loaded epoxy adhesive. The source and gate leads may then be wire bonded to lead frame pins and the die and lead frame can then be overmolded with a plastic mold. The device may, for example, define a bidirectional switch structure with a common drain.

Alternatively, the package may contain one (or more) power die on one side of the lead frame mounting pad and a control IC therefore on the other side of the lead frame pad. In this case, the IC may be electrically isolated from the lead frame, using an insulation polyimide film or an insulation die attach adhesive.

The die attach process may involve two stages, one for each die. Each stage involves an adhesive dispense step, a die placement step and a cure step for each die. Alternatively, an adhesive with a suitable uncured adhesive strength which can hold the die in place can be used to temporarily hold the die in place on the lead frame and the two die adhesive bonds may be cured simultaneously.

Note that one or more of the die may be thinned prior to die bonding to minimize package height.

After both die are bonded to the lead frame, electrical connection to the lead frame pins is made, using either wire bonding or a copper strap technology. In the case of wire bonding, very low resistance material, such as gold or aluminum is preferably used.

Once the electrical connections are completed between both die and lead frame pins, the assembly is encapsulated in mold compound in the well known manner. The whole assembly is then cured at a high curing temperature. Each device assembly is then separated from the lead frame using typical trim and singulation stages. The singulated devices are then tested and laser marked as usual for semiconductor device packages.

The novel package of the invention is useful where:

Low $R_{DSON}$ devices are required;

Space is at a premium (i.e. in portable hand held applications);

Where "smart" switching (FET plus control IC) is required with a small footprint;

Where MOSFETs with a common drain topology are required, as in battery protection circuit.

The present invention provides the benefit of doubling device active area for a given package area, compared with standard surface mounted transistor devices; and can provide smart power MOSFET devices without compromising MOSFET active area for a given footprint area.

DETAILED DESCRIPTION OF EMBODIMENTS OF THE INVENTION

Figure 1:
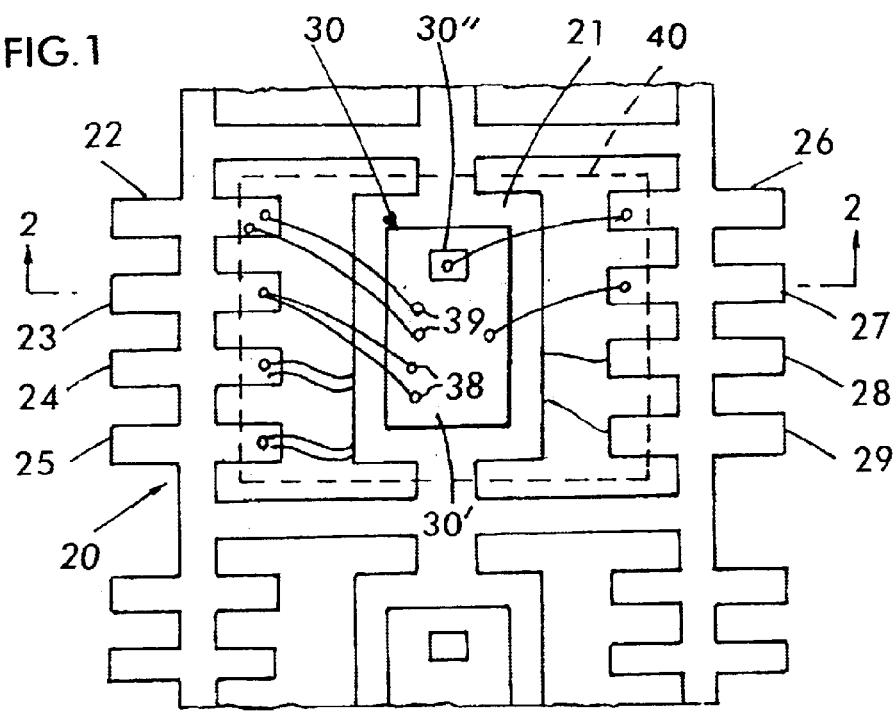
FIG. 1 is a top view of a lead frame segment with a top die in place and wire bonded to the lead frame pins.

Referring first to FIG. 1, there is shown a conventional lead frame 20 which is a thin conductive stamping of copper or a copper alloy or the like which has a plurality of identical segments, one of which is shown. The segment shown has an enlarged die-receiving pad 21 and a plurality of lead pins 22 to 29, 4 pins on each side of the pad 21 to define an 8 pin in-line package. Other numbers of pins and different package pin-out topologies can also be used with the invention.

Figure 2:
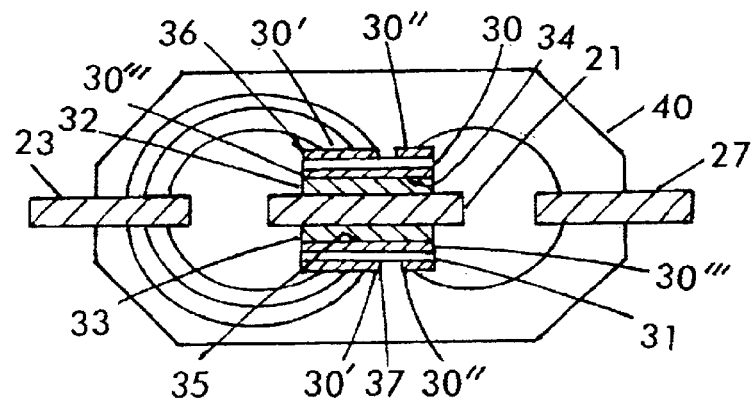
FIG. 2 is a cross-section of FIG. 1 taken across section line 2—2 in FIG. 1 and shows both top and bottom power MOSFET die connected to the top and bottom surfaces of a common lead frame pad.
Figure 4:
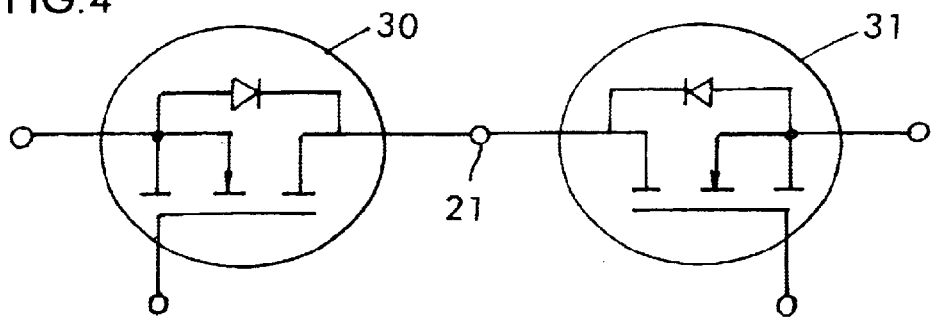
FIG. 4 is a circuit diagram of the device of FIGS. 1 to 3.

In accordance with the invention, and as shown in FIGS. 1 and 2, the drain electrodes of two power MOSFET die 30 and 31 are conductively fixed to the opposite top and bottom surfaces of the lead frame 21. Thus, they can be connected by conductive adhesive layers such as layers 32 and 33 respectively in FIG. 2. Layers 32 and 33 may be epoxies with silver particles loaded therein. Solder and tape can also be used. The first and second die are bonded so that they will not release from the lead frame during solder reflow. This arrangement connects the drains 30''', 31''' of each of MOSFETs 30 and 31 to a common drain node D (pad 21) as shown in FIG. 4.

The source electrodes 30', 31' on the opposite surfaces of MOSFETs 30 and 31 and the gate electrodes 30" and 31" on the same surfaces are then wire bonded to selected ones of the lead frame pins. Thus, sets of wire bonds connect the source electrode of die 30 to pins 22 and 23 while the gate electrode of die 30 is wire-bonded to pin 26.

The bottom die 31 is similarly wire-bonded to other pins and, for example, its source electrode can be wire-bonded to pins 24 and 25 and its gate wire-bonded to pin 29. The sources of die 30 and 31 may also be bonded to pins 27 and 28 respectively so that the gate pin for each MOSFET is adjacent a respective source (Kelvin) pin.

The various electrodes of die 30 and 31 can be connected to different pins, as desired and the pins can be internally connected within the package. Further, die 30 and 31 could be IGBT or thyristor die or diodes if desired, and different combinations of such die, for example, one IGBT die and a series connected diode die could be used.

Figure 3:
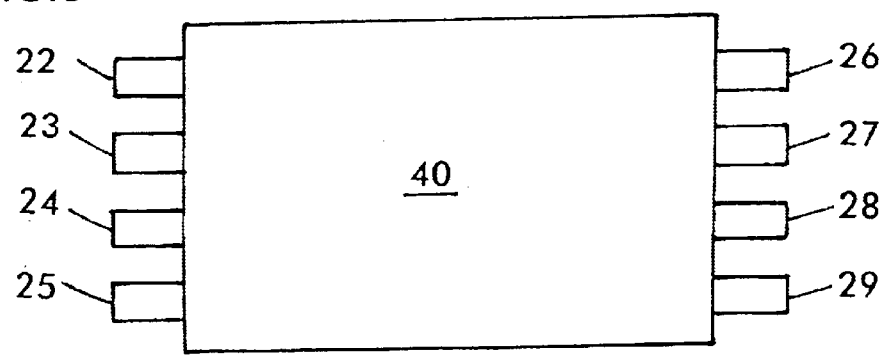
FIG. 3 is a top view of the singulated package of FIG. 2 and shows the output pin out pattern of the package.

After wire bonding, the lead frame is overmolded with suitable plastic housing, shown as housing 40 (in dotted lines in FIG. 1 and in solid line in FIGS. 2 and 3.

Since die 30 and 31 are arranged atop one another (in spacial overlapping relation), the area they occupy in the package is reduced.

The resulting circuit shown in FIG. 4 is a common drain bidirectional switching device which is very useful in numerous applications such as for battery protection and the like. Further, the resulting package has a relatively small footprint as is very desirable for portable electronic applications such as cellular telephones and other hand held or portable devices such as pocket organizers and lap-top computers.

Figure 5:
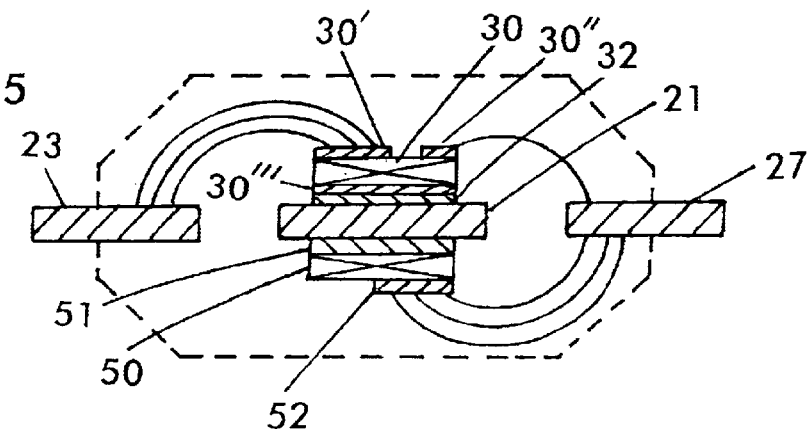
FIG. 5 is a cross-section of a second embodiment of the invention in which a single power MOSgated device and an integrated control circuit die therefor are mounted on opposite surfaces of a single lead frame pad.
Figure 6:
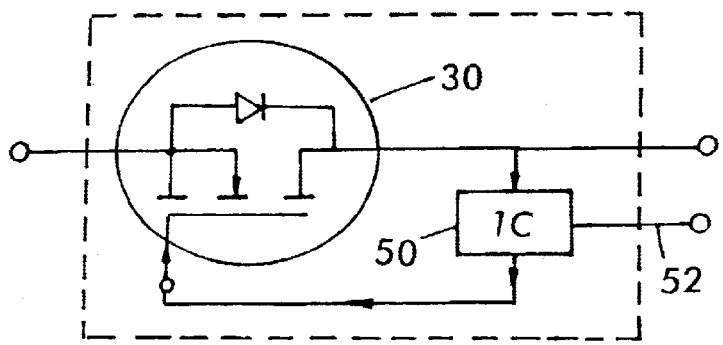
FIG. 6 is a circuit diagram of the device of FIG. 5.
Figure 7:
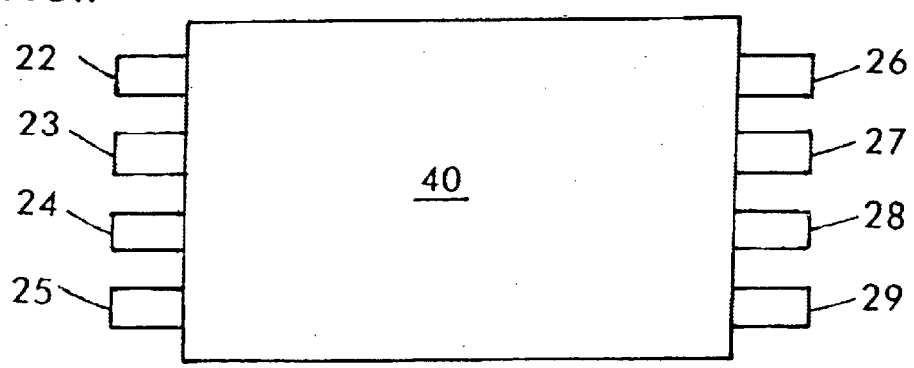
FIG. 7 is a top view of the package of the device of FIGS. 5 and 6.

FIGS. 5, 6 and 7 show another embodiment of the invention in which power semiconductor device 30 is copacked with a control integrated circuit (IC) die 50 which controls device 30 and can act to turn device 30 on and off in response to such parameters as temperature (of die 30), current, over and undervoltages, rate of current and the like. Thus, the overall device becomes a "smart" MOSgated device.

In FIGS. 5, 6 and 7, parts identical to these of FIGS. 1 to 4 have the same identifying numeral. The IC die 50 is connected to the bottom of pad 21 by an insulation adhesive 51 (FIG. 5) such as a polyimide or the like. The IC can derive its operating power from leads 23 and 27 and has a control input terminal connected to pin 26 and an output line 52 which is internally wire bonded to the gate electrode of die 30. The source electrode 30' of die 30 may be wire bonded to one or more of pins 22 to 25.

The final device package 40 has the same reduced "footprint" as that of FIGS. 1 to 4 and thus desirable for use in portable electronics.

It should be further noted that the package 40 will have a small height. The die 30 and 31 can be back-ground down to be as thin as possible to reduce this height.

In a still further embodiment of the invention, a buck converter circuit can be produced in which the top die 30 of FIG. 2 would be an N channel synchronous MOSFET and the bottom die 31 a P channel control MOSFET. Any number of other circuits with mixed MOSgated devices could be employed.

Although the present invention has been described in relation to particular embodiments thereof, many other variations and modifications and other uses will apparent to those skilled in the art. It is preferred, therefore, that the present invention be limited not by the specific disclosure herein, but only by the appended claims.

What is claimed is:

1. A semiconductor device comprising:
    a lead frame, said lead frame including a conductive die pad consisting of a conductive material and having a first major surface and a second major surface opposite said first major surface, and a first plurality of leads disposed at a first edge of said conductive die pad and a second plurality of leads disposed at a second edge of said conductive die pad, said second edge of said conductive die pad being opposite to said first edge of said conductive die pad;
    a first semiconductor die having a first major electrode of a first functionality disposed on a first major surface thereof, and a second major electrode of a second functionality disposed on a second major surface, opposite of the first major surface thereof, said first major electrode of said first semiconductor die being directly mounted on and electrically connected to said first major surface of said conductive die pad through a first conductive adhesive layer
    a second semiconductor die having a first major electrode of a first functionality disposed on a first major surface thereof, and a second major electrode of a second functionality disposed on a second major surface opposite of the first major surface thereof, said first major electrode of said second semiconductor die being directly mounted on and electrically connected to said second major surface of said conductive die pad through a second conductive adhesive layer and
    a molded housing encapsulating said conductive die pad, said first semiconductor die, said second semiconductor die, and portions of said first plurality of leads and said second plurality of lead;
    wherein said second major electrode of said first semiconductor die is electrically connected to one of said first plurality of leads or one of said second plurality of leads and said second major electrode of said second semiconductor die is electrically connected to one of said first plurality of leads or one of said second plurality of leads and said conductive die pad is electrically connected to one of said second plurality of leads or one of said first plurality of leads, such that said first major electrode of said first semiconductor die is electrically connected by said conductive material of said conductive die pad to said first major electrode of said second semiconductor die and to said at least one of said second plurality of leads or one of said first plurality of leads.

2. A semiconductor device according to claim 1, wherein one of said first semiconductor die and said second semiconductor die is a MOSFET.

3. A semiconductor device according to claim 1, wherein said first semiconductor die includes a control electrode on said second major surface thereof, and said second semiconductor die includes a control electrode on said second major surface thereof.

4. A semiconductor device according to claim 3, wherein each of said first semiconductor die and said second semiconductor die is a MOSFET, said control electrode is a gate electrode, said first major electrode is a drain electrode, and said second major electrode is a source electrode, and wherein said gate electrodes of said MOSFETs are electrically connected to one of said plurality of second leads, said source electrodes of said MOSFETs are electrically connected to another one of said second plurality of leads, and said conductive die pad is electrically connected to the remaining leads of said second plurality of leads, and said source electrodes of said MOSFETs are also connected to said first plurality of leads.

5. A semiconductor device according to claim 4, wherein at least one electrical connection is made by wire bonding.

6. A semiconductor device according to claim 1, wherein said first plurality of leads include four spaced leads, and said second plurality of leads include four spaced leads.

7. A semiconductor device according to claim 1, wherein said first major electrode is a drain electrode of a MOSFET die and said second major electrode is a source electrode of a MOSFET die.

8. A semiconductor device according to claim 1, wherein said first plurality of leads are spaced from said conductive die pad and said second plurality of leads are spaced from said conductive die pad.

\* \* \* \* \*